US012622225B2

(12) United States Patent
Kuno et al.

(10) Patent No.: US 12,622,225 B2
(45) Date of Patent: May 5, 2026

(54) MEMBER FOR SEMICONDUCTOR MANUFACTURING APPARATUS

(71) Applicant: NGK INSULATORS, LTD., Nagoya-City (JP)

(72) Inventors: Tatsuya Kuno, Nagoya-City (JP); Seiya Inoue, Handa-City (JP)

(73) Assignee: NGK INSULATORS, LTD., Nagoya (JP)

(*) Notice: Subject to any disclaimer, the term of this patent is extended or adjusted under 35 U.S.C. 154(b) by 361 days.

(21) Appl. No.: 18/510,850

(22) Filed: Nov. 16, 2023

(65) Prior Publication Data

US 2025/0014939 A1     Jan. 9, 2025

Related U.S. Application Data

(63) Continuation of application No. PCT/JP2023/025160, filed on Jul. 6, 2023.

(51) Int. Cl.
*H01L 21/687* (2006.01)
*H01L 21/67* (2006.01)

(52) U.S. Cl.
CPC .. *H01L 21/68757* (2013.01); *H01L 21/67103* (2013.01); *H01L 21/68785* (2013.01)

(58) Field of Classification Search
CPC .......................... H01L 21/6833; H01L 21/6831
See application file for complete search history.

(56) References Cited

U.S. PATENT DOCUMENTS 6,057,513 A     5/2000  Ushikoshi et al.
6,486,542 B1    11/2002  Ohashi et al.
(Continued)

FOREIGN PATENT DOCUMENTS

JP      4522599 B2 *   8/2010
JP      5029257 B2 *   9/2012   ....... H01L 21/67103
(Continued)

OTHER PUBLICATIONS

International Search Report and Written Opinion (Application No. PCT/JP2023/025160) dated Aug. 22, 2023 (6 pages).
(Continued)

*Primary Examiner* — Jason L Vaughan
(74) *Attorney, Agent, or Firm* — BURR PATENT LAW, PLLC

(57) ABSTRACT

A member for semiconductor manufacturing apparatus includes a ceramic plate in which an electrode is embedded; a power feeder receiving hole extending from a lower surface of the ceramic plate to a position close to the electrode; a power feeder inserted in the power feeder receiving hole; a recess extending from a bottom surface of the power feeder receiving hole to the electrode or an electrode lead-out portion attached to the electrode, the recess having an opening diameter smaller than a diameter of the power feeder receiving hole and greater than or equal to a diameter of the power feeder; a first brazing material layer filling the recess; and a second brazing material layer bonding an entire end surface of the power feeder to the first brazing material layer and not extending to a boundary between the bottom surface and a side surface of the power feeder receiving hole.

6 Claims, 3 Drawing Sheets

(56)                References Cited

U.S. PATENT DOCUMENTS

| | | | |
|---|---|---|---|
| 8,414,704 B2 * | 4/2013 | Fujii | ................... H01L 21/6833 |
| | | | 118/728 |
| 11,081,381 B2 * | 8/2021 | Tsuchida | .............. B23K 1/0008 |
| 11,869,796 B2 * | 1/2024 | Yabuhana | ......... H01L 21/68785 |
| 2016/0358801 A1 | 12/2016 | Minami et al. | |
| 2020/0173017 A1 | 6/2020 | Ramalingam et al. | |
| 2022/0102180 A1 | 3/2022 | Yabuhana | |

FOREIGN PATENT DOCUMENTS

| | | | | |
|---|---|---|---|---|
| JP | 2018-203581 A | | 12/2018 | |
| JP | 2020-155448 A | | 9/2020 | |
| JP | 2020191199 A | * | 11/2020 | |
| JP | 2021-027180 A | | 2/2021 | |
| JP | 2021015928 A | * | 2/2021 | |
| JP | 2022-034701 A | | 3/2022 | |
| KR | 10-2000-0011983 A | | 2/2000 | |
| KR | 10-2006-0086492 A | | 8/2006 | |
| KR | 10-2021-0107085 A | | 8/2021 | |
| WO | WO-2008087983 A1 | * | 7/2008 | ....... H01L 21/67103 |
| WO | 2015/133576 A1 | | 9/2015 | |

OTHER PUBLICATIONS

Korean Office Action dated Nov. 29, 2024 (Application No. 10-2023-7040039).
English translation of the International Preliminary Report on Patentability (Chapter I) dated Jan. 15, 2026 (Application No. PCT/JP2023/025160).

* cited by examiner

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

Semiconductor manufacturing apparatus includes a member for semiconductor manufacturing apparatus such as a ceramic heater for heating wafers and an electrostatic chuck for attracting and holding wafers. Regarding a member for semiconductor manufacturing apparatus of this type, PTL 1 discloses a structure of bonding a power feeder to an electrode embedded in a ceramic plate. Specifically, the ceramic plate has a power feeder receiving hole that extends from the lower surface to a position close to the electrode and a housing that is a recess extending from the bottom surface of the power feeder receiving hole to an electrode lead-out portion attached to the electrode. The housing houses a first metal disc. The first metal disc is bonded to the electrode lead-out portion by a first brazing material layer. The power feeder is inserted in the power feeder receiving hole with a gap therebetween. A second brazing material layer that encloses a second metal disc is located between the front-end surface of the power feeder and the first metal disc. The second brazing material layer covers the entire bottom surface of the power feeder receiving hole (i.e., extends to the boundary between the bottom surface and the side surface of the power feeder receiving hole). Furthermore, the second brazing material layer is in contact with the entire front-end surface of the power feeder and has a portion carried up along the side surface of the power feeder (FIG. 3 in PTL 1). Alternatively, the second brazing material layer is in contact with a middle portion but not in contact with an outer circumferential portion of the front-end surface of the power feeder (FIGS. 4 and 5 in PTL 1).

CITATION LIST

Patent Literature

PTL 1: JP 2018-203581 A (Especially FIGS. 3 to 5)

SUMMARY OF THE INVENTION

In PTL 1, the second brazing material layer covers the entire bottom surface of the power feeder receiving hole (i.e., extends to the boundary between the bottom surface and the side surface of the power feeder receiving hole). Thus, if the second brazing material layer is designed to be in contact with the entire front-end surface of the power feeder, the second brazing material is likely to be carried up along the side surface of the power feeder during production. In such a case, the amount of the second brazing material between the front-end surface of the power feeder and the second metal disc or between the second metal disc and the first metal disc may become insufficient, and thus voids (pores) may be formed there. The voids may cause problems such as poor power supply. In contrast, if the second brazing material layer is designed to be in contact only with the middle portion of the front-end surface of the power feeder, the contact area is too small. This may cause problems such as poor power supply.

The present invention was made to solve the above-described problems, and the main object thereof is to enable a power feeder to successfully supply power to an electrode embedded in a ceramic plate.

[1] A member for semiconductor manufacturing apparatus according to the present invention includes: a ceramic plate having a wafer placement surface on an upper surface and in which an electrode is embedded; a power feeder receiving hole extending from a lower surface of the ceramic plate to a position close to the electrode; a power feeder inserted in the power feeder receiving hole with a gap therebetween; a recess extending from a bottom surface of the power feeder receiving hole to the electrode or to an electrode lead-out portion attached to the electrode, the recess having an opening diameter smaller than a diameter of the power feeder receiving hole and greater than or equal to a diameter of the power feeder; a first brazing material layer filling the recess; and a second brazing material layer bonding an entire end surface of the power feeder to the first brazing material layer and not extending to a boundary between the bottom surface and a side surface of the power feeder receiving hole.

In the member for semiconductor manufacturing apparatus, the opening diameter of the recess is smaller than the diameter of the power feeder receiving hole and greater than or equal to the diameter of the power feeder. The first brazing material layer fills the recess. The second brazing material layer bonds the entire end surface of the power feeder to the first brazing material layer. The second brazing material layer does not extend to the boundary between the bottom surface and the side surface of the power feeder receiving hole. If the second brazing material layer extends to the boundary, the second brazing material is likely to be carried up from the boundary along the side surface of the power feeder receiving hole or along the side surface of the power feeder during production. This is likely to form voids (pores) in the second brazing material layer located between the power feeder and the first brazing material layer. However, the second brazing material layer here does not extend to the boundary. Thus, the second brazing material is less likely to be carried up along the side surface of the power feeder receiving hole or along the side surface of the power feeder during production, and voids are less likely to be formed in the second brazing material layer between the power feeder and the first brazing material layer. Thus, the power feeder can successfully supply power to the electrode embedded in the ceramic plate.

The "boundary" is a portion where the bottom surface and the side surface of the power feeder receiving hole meet. If the "boundary" is not chamfered, the "boundary" is an edge where the bottom surface and the side surface of the power feeder receiving hole meet. If the edge is chamfered, the "boundary" is a portion including the chamfered edge (e.g., the entire C-chamfered surface in the case of C-chamfering or the entire R-chamfered surface in the case of R-chamfering).

[2] In the member for semiconductor manufacturing apparatus of the present invention (the member for semiconductor manufacturing apparatus according to above [1]), the boundary may be chamfered, and the second brazing material layer need not extend to the chamfered boundary. This can prevent cracks from occurring at the boundary of the power feeder receiving hole. Furthermore, the second brazing material is further less likely to be carried up along the side surface of the power feeder receiving hole and the side surface of the power feeder during production, because the second brazing material layer does not extend to the chamfered boundary.

[3] In the member for semiconductor manufacturing apparatus of the present invention (the member for semiconductor manufacturing apparatus according to the above [1] or [2]), the power feeder may be chamfered to less than or equal to C0.3 or less than or equal to R0.3 at an edge of the end surface. With this configuration, the end surface of the power feeder can have a large area, and thus the contact area between the end surface of the power feeder and the second brazing material layer can be made large.

[4] In the member for semiconductor manufacturing apparatus of the present invention (the member for semiconductor manufacturing apparatus according to any one of the above [1] to [3]), the first brazing material layer may contain an active metal, and the second brazing material layer may contain no active metal or less active metal content than the first brazing material layer. In the formation of the first brazing material layer, the first brazing material that contains an active metal readily spreads wet on the surface of the recess (ceramic plate). On the other hand, in the formation of the second brazing material layer, the second brazing material that contains no active metal or a little active metal is unlikely to spread wet on the surface of the ceramic plate and is unlikely to extend to the boundary of the power feeder receiving hole.

[5] In the member for semiconductor manufacturing apparatus of the present invention (the member for semiconductor manufacturing apparatus according to the above [4]), wherein an interface between the first brazing material layer and the second brazing material layer is an area where components of the first brazing material layer and components of the second brazing material layer are diffused. During production, the second brazing material layer that contains no active metal or a little active metal is formed on the first brazing material layer that contains an active metal. The interface between the first brazing material layer and the second brazing material layer is likely to become an area where the components of both the layers are diffused and mixed.

[6] The member for semiconductor manufacturing apparatus of the present invention (the member for semiconductor manufacturing apparatus according to any one of the above [1] to [5]) may further include a cooling plate having electrical conductivity and located adjacent to a lower surface of the ceramic plate, and a cooling plate through hole extending through the cooling plate in an up-down direction to be in communication with the power feeder receiving hole and through which the power feeder is inserted. In this configuration, the distance (insulation distance) between the second brazing material layer and the cooling plate is long compared to the case where the second brazing material layer has a portion along the side surface of the power feeder receiving hole, because the second brazing material layer does not extend to the boundary between the bottom surface and the side surface of the power feeder receiving hole.

DETAILED DESCRIPTION OF THE INVENTION

Figure 1:
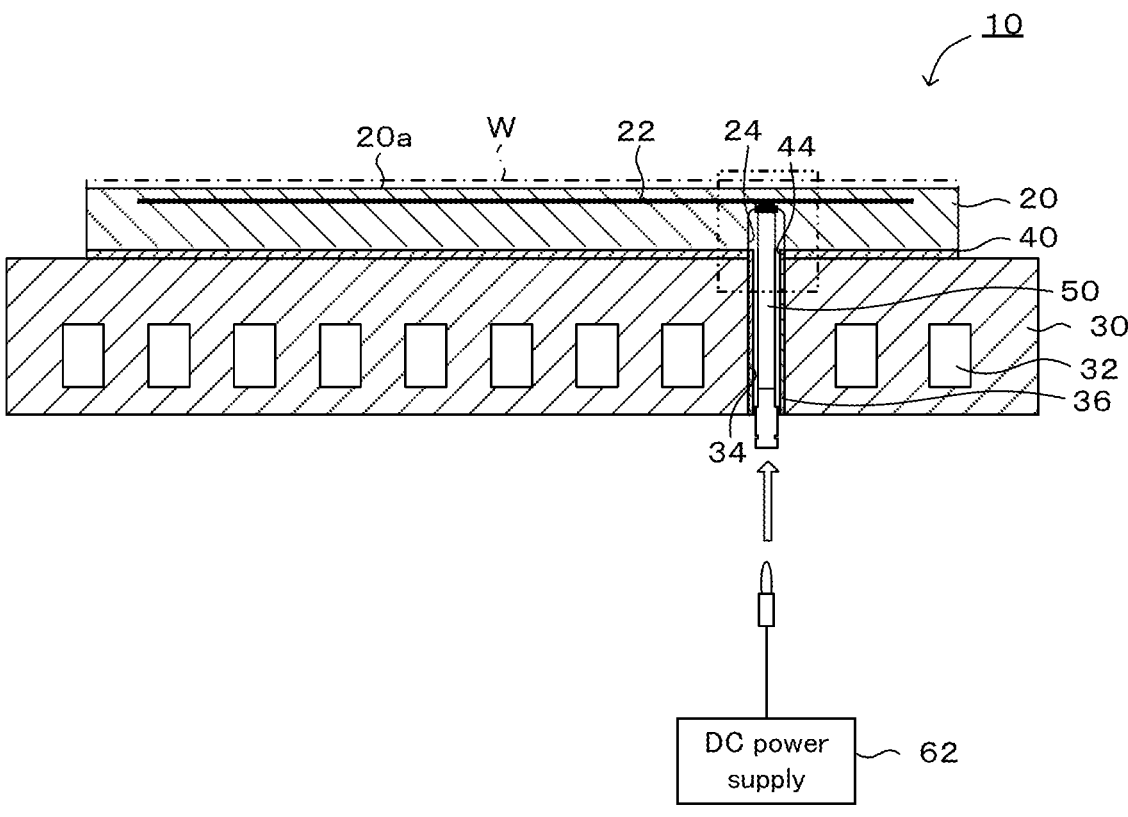
FIG. 1 is a cross-sectional view illustrating a schematic structure of a wafer placement table 10.
Figure 2:
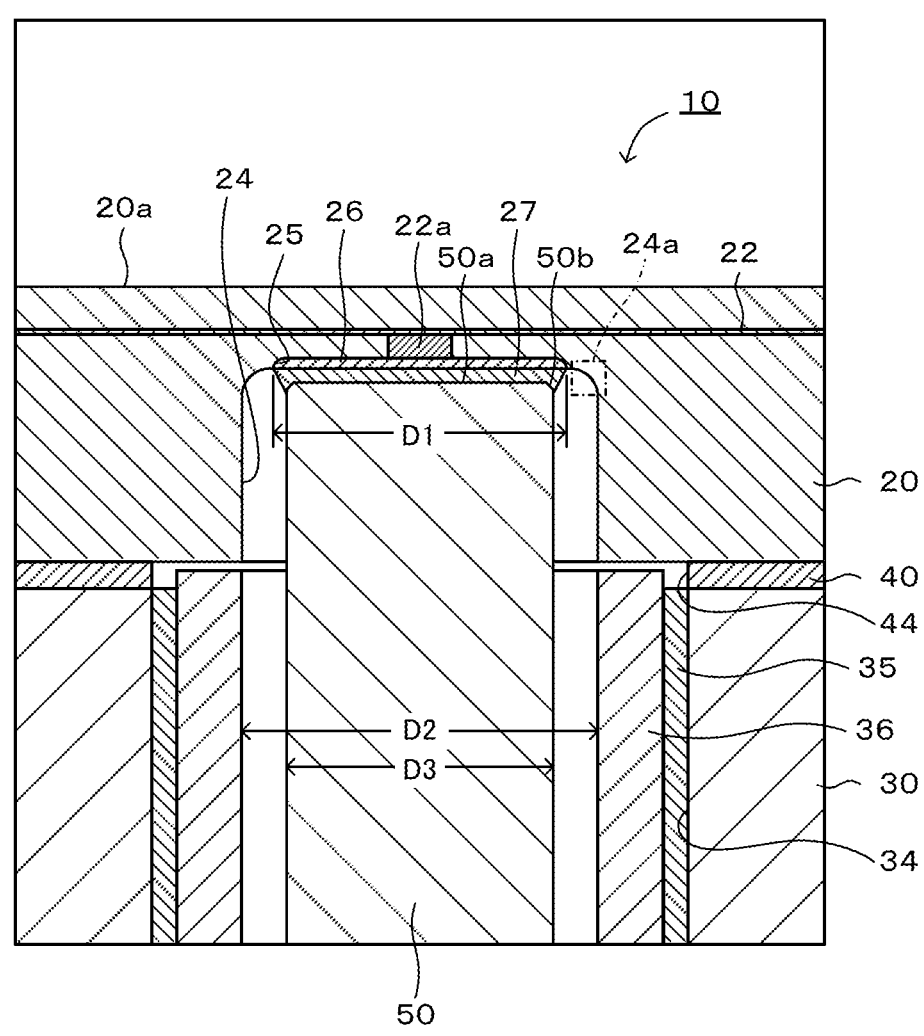
FIG. 2 is a partial magnified view of FIG. 1.

FIG. 1 is a cross-sectional view illustrating a schematic configuration of a wafer placement table 10 of this embodiment (cross-sectional view taken along a plane extending along the central axis of the wafer placement table 10). FIG. 2 is a partial magnified view of FIG. 1 (magnified view of a boxed portion indicated by a two-dot-dash line). In the following description, terms such as up and down, left and right, and front and back may be used, but such terms indicate only relative positional relationships.

The wafer placement table 10 is an example of a member for semiconductor manufacturing apparatus that processes wafers W. As illustrated in FIG. 1, the wafer placement table 10 includes a ceramic plate 20, a cooling plate 30, a bonding layer 40, and a power feeder 50.

The ceramic plate 20 is a disc-shaped member and has a wafer placement surface 20a on the upper surface. The ceramic plate 20 is formed of a ceramic-containing material. The ceramic-containing material contains a ceramic as a main component and may contain, in addition to the ceramic, components derived from sintering aids (e.g., rare earth elements) and inevitable components. The "main component" accounts for greater than or equal to 50% by mass of the total. The ceramic may be, for example, alumina or aluminum nitride.

An electrostatic electrode 22 is embedded in the ceramic plate 20. The electrostatic electrode 22 is formed of a material containing a metal, such as W, Mo, WC, or MoC. The metal forming the electrostatic electrode 22 preferably has a coefficient of thermal expansion close to that of the ceramic plate 20. The electrostatic electrode 22 may contain the ceramic contained in the ceramic plate 20 such that the coefficient of thermal expansion of the electrostatic electrode 22 becomes closer to that of the ceramic plate 20. The electrostatic electrode 22 is a disc-shaped or mesh-patterned unipolar electrostatic electrode. The layer of the ceramic plate 20 above the electrostatic electrode 22 serves as a dielectric layer. A DC power supply 62 for electrostatic attraction is coupled to the electrostatic electrode 22 via the power feeder 50.

The cooling plate 30 is a disc-shaped member internally having a refrigerant flow path 32 through which a refrigerant can circulate. The refrigerant flow path 32 extends in a one-stroke pattern from one end to the other end over the entire area of the ceramic plate 20 in plan view. The one end and the other end of the refrigerant flow path 32 are connected to a refrigerant circulation pump (not illustrated) that can regulate the temperature of the refrigerant. The cooling plate 30 is formed, for example, of a conductive material containing metal. Examples of the conductive material include composite materials and metal. An example of the composite materials is a metal composite material (also called a metal matrix composite (MMC)), for example. Examples of MMC include a material containing Si, SiC, and Ti and porous SiC materials impregnated with Al and/or Si. A material including Si, SiC, and Ti is referred to as SisiCTi, a material including a porous SiC material impregnated with Al is referred to as AlSiC, and a material including a porous SiC material impregnated with Si is referred to as SiSiC. Examples of the metal include Al, Ti, Mo, and alloys of them. The conductive material of the cooling plate 30 preferably has a coefficient of thermal expansion close to that of the ceramic plate 20.

The bonding layer 40 bonds the lower surface of the ceramic plate 20 and the upper surface of the cooling plate 30 to each other. The bonding layer 40 may be a metal bonding layer formed of brazing material or a metal brazing material, for example. The metal bonding layer may be formed, for example, by TCB (thermal compression bonding). TCB is a widely known method including placing a metal bonding material between two bonding target members and pressure-bonding the two members heated to a temperature lower than or equal to the solidus line temperature of the metal bonding material. An organic adhesive layer may be employed as the bonding layer 40 instead of the metal bonding layer.

The power feeder 50 is a metal member that supplies power to the electrostatic electrode 22. The power feeder 50 is, for example, a metal rod. Examples of the metal forming the power feeder 50 include W, Mo, and Ni. The metal preferably has a coefficient of thermal expansion close to that of the ceramic plate 20. The power feeder 50 is inserted from the lower surface of the cooling plate 30 through the cooling plate through hole 34, which extends through the cooling plate 30 in the up-down direction, and the bonding layer through hole 44, which extends through the bonding layer 40 in the up-down direction, to the power feeder receiving hole 24 in the ceramic plate 20. The bonding layer through hole 44 and the cooling plate through hole 34 have the same diameter. The power feeder 50 is electrically coupled to the electrostatic electrode 22.

The structure of bonding the power feeder 50 to the electrostatic electrode 22 is described with reference to FIG. 2. The power feeder 50 is in an insulating sleeve 36 placed in the cooling plate through hole 34 and is in the power feeder receiving hole 24 with a gap therebetween. The outer circumferential surface of the insulating sleeve 36 is attached to the inner circumferential surface of the cooling plate through hole 34 with an adhesive layer 35 therebetween. The upper end surface of the insulating sleeve 36 is positioned above the upper surface of the cooling plate 30 and below the lower surface of the ceramic plate 20. The power feeder receiving hole 24 is a cylindrical hole and extends from the lower surface of the ceramic plate 20 to a position close to the electrostatic electrode 22. The power feeder receiving hole 24 is chamfered at a boundary 24a between the bottom surface and the side surface (the boxed area indicated by a two-dot-dash line in FIG. 2). The chamfering may be R-chamfering or C-chamfering. The power feeder receiving hole 24 has a recess 25 at the bottom surface. The recess 25 extends to the electrode lead-out portion 22a attached to the electrostatic electrode 22. The opening diameter D1 of the recess 25 is smaller than the diameter D2 of the power feeder receiving hole 24 and greater than or equal to the diameter D3 of the power feeder member 50. The opening of the recess 25 does not extend to the chamfered boundary 24a of the power feeder receiving hole 24.

The power feeder 50 is electrically coupled to the electrode lead-out portion 22a on the electrostatic electrode 22 via a first brazing material layer 26 and a second brazing material layer 27. The electrode lead-out portion 22a is a disc-shaped member formed of the same material as the electrostatic electrode 22. The lower surface of the electrode lead-out portion 22a is exposed at the bottom surface of the recess 25.

The first brazing material layer 26 fills the recess 25. The first brazing material layer 26 is a layer formed of first brazing material containing an active metal. The surface (lower surface) of the first brazing material layer 26 is flush with the bottom surface of the power feeder receiving hole 24. The first brazing material may be silver brazing material, copper brazing material, nickel brazing material, gold brazing material, or palladium brazing material each containing an active metal. Examples of the active metal include titanium, zirconium, hafnium, vanadium, niobium, and beryllium. Specific examples of the first brazing material include Ag—Cu—Ti brazing material and Ag—Cu—Ti—Sn brazing material. The first brazing material is processed at higher than or equal to 700° C., and thus chemical reaction may occur at the interface between the ceramic plate 20 and the first brazing material and form a reaction layer. Such a reaction layer may increase the bonding strength between the ceramic plate 20 and the first brazing material layer 26.

The second brazing material layer 27 bonds the entire front-end surface 50a of the power feeder 50 to the first brazing material layer 26. The brazing material brazing material layer 27 does not extend to the boundary 24a of the power feeder receiving hole 24. The second brazing material layer 27 is a layer formed of second brazing material not containing an active metal. Examples of the second brazing material include Au—Ge brazing material, Au—Sn brazing material, and Au—Si brazing material. The second brazing material basically spreads wet on the surface of the first brazing material layer 26 but is unlikely to spread wet on the surface of the ceramic plate 20. Thus, the second brazing material layer 27 is formed without largely protruding from the first brazing material layer 26. The melting point of the second brazing material is lower than that of the first brazing material (e.g., 200° C. to 500° C.), and thus the processing temperature of the second brazing material is lower than that of the first brazing material.

As the area of the front-end surface 50a of the power feeder 50 increases, the bonding area between the front-end surface 50a and the second brazing material layer 27 increases. Thus, the front-end surface 50a need not be chamfered at the edge 50b. However, chamfering may be performed. In such a case, it is preferable that the front-end surface 50a be C-chamfered to less than or equal to C0.3 or R-chamfered to less than or equal to R0.3.

Next, a usage example of the wafer placement table 10 will be described. First, the wafer placement table 10 is disposed in a vacuum chamber (not illustrated), and then a wafer W is placed on a wafer placement surface 20a of the wafer placement table 10. Then, the DC power supply 62 applies a voltage to the electrostatic electrode 22 via the power feeder 50. This allows the wafer W to be attracted and fixed to the wafer placement surface 20a. Then, the inside of the vacuum chamber is made to have a vacuum atmosphere or a reduced-pressure atmosphere, and the wafer W is processed in the vacuum chamber. For example, the wafer W may be treated with plasma. In such a case, a top electrode having a shower head is placed on the ceiling of the vacuum chamber, and, while reaction gas is supplied from the shower head to the space between the wafer W and the top electrode, a high-frequency voltage is applied between the top electrode and the cooling plate 30 to generate plasma. After the processing of the wafer W, the application of voltage to the electrostatic electrode 22 is stopped. This stops the attraction and fixation of the wafer W to the wafer placement surface 20a. A refrigerant is fed to the refrigerant flow path 32 when the wafer W needs to be cooled.

Next, among the steps in the process of producing the wafer placement table 10, the step of bonding the power feeder 50 to the electrostatic electrode 22 is explained with reference to FIGS. 3A to 3D. FIGS. 3A to 3D illustrate the steps.

Figures 3A, 3B, 3C, 3D:
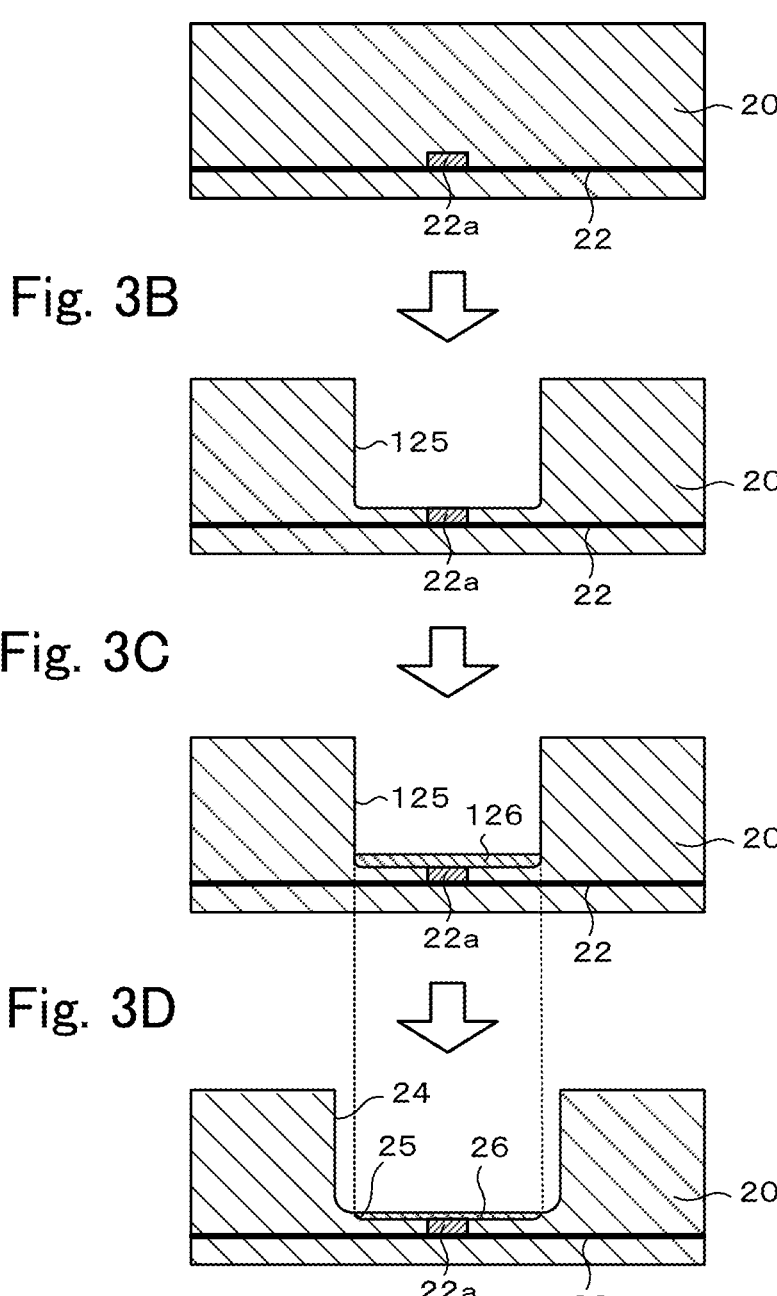
FIGS. 3A to 3D illustrate steps of bonding a power feeder 50 to an electrostatic electrode 22.

First, the ceramic plate 20 in which the electrostatic electrode 22 and the electrode lead-out portion 22a in contact with the electrostatic electrode 22 are embedded is produced (FIG. 3A). The ceramic plate 20 can be produced by a known method. In FIGS. 3A to 3D, the surface of the ceramic plate 20 that becomes the wafer placement surface 20a faces downward.

Then, a cylindrical first hole 125 extending from one surface of the ceramic plate 20 to the electrode lead-out portion 22a (FIG. 3B) is formed. At this time, the first hole 125 is formed so that the electrode lead-out portion 22a is exposed at the bottom surface of the first hole 125. The first hole 125 can be formed, for example, by counterboring. The first hole 125 and the opening of the recess 25 have the same diameter. The boundary between the bottom surface and the side surface of the first hole 125 has a chamfered shape.

Then, the first brazing material layer 126 is formed on the entire bottom surface of the first hole 125 (FIG. 3C). The process of forming the first brazing material layer 126 may include the steps of cutting a sheet of the first brazing material containing an active metal to the size of the bottom surface of the first hole 125, heating and melting the first brazing material while the sheet of the first brazing material is on the bottom surface of the first hole 125, and cooling the first brazing material to be solidified. Alternatively, the first brazing material layer 26 may be formed by a vapor phase method (CVD, sputtering) or a liquid phase method (electrolytic, electroless plating).

Then, the power feeder receiving hole 24, which is a cylindrical second hole, is formed coaxial with the first hole 125 (FIG. 3D) to extend from the surface of the ceramic plate 20 having the first hole 125 toward the first brazing material layer 126. The power feeder receiving hole 24 can be formed, for example, by counterboring. The power feeder receiving hole 24 is formed to have the bottom surface at the position above the bottom surface of the first hole 125 and below the surface of the first brazing material layer 126. The boundary 24a between the bottom surface and the side surface of the power feeder receiving hole 24 has a chamfered shape. When the power feeder receiving hole 24 is formed, the surface layer of the first brazing material layer 126 is scraped off to form the first brazing material layer 26 (FIG. 3D), and the surface of the first brazing material layer 26 becomes flush with the bottom surface of the power feeder receiving hole 24.

Then, a sheet of the second brazing material containing no active metal (or containing less active metal content than the first brazing material) is then placed on the first brazing material layer 26, and the power feeder 50 is placed on the second brazing material. In other words, a sheet of the second brazing material is sandwiched between the first brazing material layer 26 and the front-end surface 50a of the power feeder 50. The melting point of the second brazing material is lower than that of the first brazing material. The size of the sheet of the second brazing material is adjusted such that the sheet of the second brazing material that has been solidified after being melted has substantially the same size as the size of the first brazing material layer 26. In this state, the processing is performed at a temperature higher than or equal to the melting point of the second brazing material and below the melting point of the first brazing material. This allows the second brazing material to melt. The second brazing material readily spreads wet on the surface of the first brazing material layer 26 but is unlikely to spread wet beyond the first brazing material layer 26 (the ceramic plate 20). Thus, the second brazing material that has been solidified to form the second brazing material layer 27 generally remains in the area of the first brazing material layer 26. As a result, the diameter of the second brazing material layer 27 is greater than or equal to the diameter D2 of the power feeder 50, and the second brazing material layer 27 does not extend to the chamfered boundary 24a of the power feeder receiving hole 24.

When the processing is performed at a temperature higher than or equal to the melting point of the second brazing material and below the melting point of the first brazing material, the components in the first brazing material layer 26 and the components of the second brazing material are diffused. Thus, the interface between the first brazing material layer 26 and the second brazing material layer 27 is an area where the components of both the layers 26 and 27 are diffused. In FIG. 2, the interface between the first brazing material layer 26 and the second brazing material layer 27 is clear. However, the actual interface is an area where the components of the first and second brazing material layers 26 and 27 are diffused (gradation area).

The process of bonding the power feeder 50 to the first brazing material layer 26 may be performed before the step of bonding the cooling plate 30 to the ceramic plate 20 or after the step of bonding the cooling plate 30 to the ceramic plate 20.

In the above-described wafer placement table 10, the opening diameter D1 of the recess 25 is smaller than the diameter D2 of the power feeder receiving hole 24 and greater than or equal to the diameter D3 of the power feeder 50. The first brazing material layer 26 fills the recess 25. Thus, the first brazing material layer 26 is absent or almost absent outside the opening of the recess 25. The second brazing material layer 27 bonds the entire front-end surface 50a of the power feeder 50 to the first brazing material layer 26. This second brazing material layer 27 does not extend to the boundary 24a of the power feeder receiving hole 24. If the second brazing material layer 27 extends to the boundary 24a, the second brazing material is likely to be carried up from the boundary 24a along the side surface of the power feeder receiving hole 24 or along the side surface of the power feeder 50 during production. Thus, voids (pores) are likely to be formed in the second brazing material layer 27 located between the power feeder 50 and the first brazing material layer 26. However, the second brazing material layer 27 here does not extend to the boundary 24a. Thus, the second brazing material is less likely to be carried up along the side surface of the power feeder receiving hole 24 or along the side surface of the power feeder 50 during production, and voids are less likely to be formed in the second brazing material layer 27 located between the power feeder 50 and the first brazing material layer 26. Thus, the power feeder 50 can successfully supply power to the electrostatic electrode 22.

Furthermore, the boundary 24a is chamfered. This can prevent cracks from occurring at the boundary 24a of the power feeder receiving hole 24. Furthermore, the second brazing material layer 27 does not extend to the chamfered boundary 24a. Thus, the second brazing material is less likely to be carried up along the side surface of the power feeder receiving hole 24 or along the side surface of the power feeder 50 during production.

Furthermore, when the edge 50b of the front-end surface 50a of the power feeder 50 is chamfered, it is preferable that the front-end surface 50a be chamfered to less than or equal to C0.3 or less than or equal to R0.3. With this configuration, the front-end surface 50*a* of the power feeder 50 can have a large area, and thus the contact area between the front-end surface 50*a* of the power feeder 50 and the second brazing material layer 27 can be made large.

Furthermore, the first brazing material layer 26 contains an active metal, and the second brazing material layer 27 contains no active metal or less active metal content than the first brazing material layer 26. In the formation of the first brazing material layer 26, the first brazing material that contains an active metal readily spreads wet on the surface of the recess 25 (ceramic plate 20). On the other hand, in the formation of the second brazing material layer 27, the second brazing material that contains no active metal or a little active metal is unlikely to spread wet on the surface of the ceramic plate 20 and is unlikely to extend to the boundary 24*a* of the power feeder receiving hole 24.

Furthermore, the interface between the first brazing material layer 26 and the second brazing material layer 27 is an area where the components of the first brazing material layer 26 and the components of the second brazing material layer 27 are diffused. During production, the second brazing material layer 27 that contains no active metal or a little active metal is formed on the first brazing material layer 26 that contains an active metal. The interface between the first brazing material layer 26 and the second brazing material layer 27 is likely to become an area where the components of both the layers are diffused and mixed.

Furthermore, this configuration in which the second brazing material layer 27 does not extend to the boundary 24*a* of the power feeder receiving hole 24 can have a longer distance between the second brazing material layer 27 and the cooling plate 30 (insulation distance) than a configuration in which the second brazing material layer 27 extends along the side surface of the power feeder receiving hole 24. Thus, this configuration can prevent dielectric breakdown.

The present invention should not be limited to the above-described embodiment and may be implemented in various modes without departing from the technical scope of the present invention.

In the above-described embodiment, the first brazing material layer 26 and the second brazing material layer 27 do not have an internal stress-relaxation member (e.g., a member formed of a material having a coefficient of thermal expansion lower than that of the power feeder 50 and higher than that of the ceramic plate 20). However, this should not be construed as limiting. For example, the first brazing material layer 26 may have an internal stress relaxation member. The second brazing material layer 27 may have an internal stress relaxation member but preferably have no internal stress relaxation member. An internal stress relation member in the second brazing material layer 27 may increase the volume of the second brazing material layer 27, making it difficult to prevent the second brazing material from being carried up along the side surface of the power feeder 50 or along the side surface of the power feeder receiving hole 24.

In the above-described embodiment, a metal rod was described as an example of the power feeder 50. However, the power feeder 50 should not be limited to this and may be a metal cable, for example.

In the above-described embodiment, the wafer placement table 10 may have at least one of a heater electrode or an RF electrode (electrode for plasma generation) in the ceramic plate 20, instead of or in addition to the electrostatic electrode 22. In such a case, the structure of bonding the heater electrode to the power feeder for the heater electrode and the structure of bonding the RF electrode to the power feeder for the RF electrode may be the same as the above-described structure of bonding the electrostatic electrode 22 to the power feeder 50.

In the above-described embodiment, the electrode lead-out portion 22*a* is attached to the electrostatic electrode 22, but the electrode lead-out portion 22*a* may be eliminated, and a portion of the electrostatic electrode 22 may be directly exposed at the bottom surface of the recess 25.

In the above-described embodiment, if the power feeder 50 is formed of a material that does not allow the second brazing material to readily spread wet on, a metal coating film that allows the second brazing material to readily spread wet on may be formed on the front-end surface 50*a* of the power feeder 50. For example, if the power feeder 50 is formed of Mo, a film made of Ni may be formed on the front-end surface 50*a*. The metal coating film may be formed on the chamfered portions of the front-end surface 50*a* and the edge 50*b* of the power feeder 50 and may have a height of less than or equal to 0.1 mm from the chamfered portion. This level of height does not allow formation of voids in the second brazing material layer 27 located between the power feeder 50 and the first brazing material layer 26.

International Application No. PCT/JP2023/025160, filed on Jul. 6, 2023, is incorporated herein by reference in its entirety.

What is claimed is:

1. A member for semiconductor manufacturing apparatus comprising:
    a ceramic plate having a wafer placement surface on an upper surface and in which an electrode is embedded;
    a power feeder receiving hole extending from a lower surface of the ceramic plate to a position close to the electrode;
    a power feeder inserted in the power feeder receiving hole with a gap therebetween;
    a recess extending from a bottom surface of the power feeder receiving hole to the electrode or an electrode lead-out portion attached to the electrode, the recess having an opening diameter smaller than a diameter of the power feeder receiving hole and greater than or equal to a diameter of the power feeder;
    a first brazing material layer filling the recess; and
    a second brazing material layer bonding an entire end surface of the power feeder to the first brazing material layer and not extending to a boundary between the bottom surface and a side surface of the power feeder receiving hole.

2. The member for semiconductor manufacturing apparatus according to claim 1, wherein the boundary is chamfered, and
    the second brazing material layer does not extend to the chamfered boundary.

3. The member for semiconductor manufacturing apparatus according to claim 1, wherein the power feeder is chamfered to less than or equal to C0.3 or less than or equal to R0.3 at an edge of the end surface.

4. The member for semiconductor manufacturing apparatus according to claim 1, wherein the first brazing material layer contains an active metal, and
    the second brazing material layer contains no active metal or less active metal content than the first brazing material layer.

5. The member for semiconductor manufacturing apparatus according to claim 4, wherein an interface between the first brazing material layer and the second brazing material layer is an area where components of the first brazing material layer and components of the second brazing material layer are diffused.

6. The member for semiconductor manufacturing apparatus according to claim 1, further comprising:

a cooling plate having electrical conductivity and located adjacent to a lower surface of the ceramic plate; and a cooling plate through hole extending through the cooling plate in an up-down direction to be in communication with the power feeder receiving hole and through which the power feeder is inserted.

* * * * *